United States Patent [19]

Boulay et al.

[11] Patent Number: 5,204,496
[45] Date of Patent: Apr. 20, 1993

[54] EMI SHIELDING GASKET

[75] Inventors: Steven G. Boulay, Schrewsbury, Mass.; Michael L. Joseph, Nashua, N.H.; Henry A. Rettstadt, Princeton, Mass.

[73] Assignee: Digital Equipment Corporation, Maynard, Mass.

[21] Appl. No.: 862,007

[22] Filed: Apr. 1, 1992

[51] Int. Cl.$^5$ ............................................. H05K 9/00
[52] U.S. Cl. .............................. 174/35 GC; 174/35 R; 361/424
[58] Field of Search .......... 174/35 GC, 35 R, 35 MS, 174/51; 361/424; 219/10.55 R, 10.55 D; 220/304, 310

[56] References Cited

U.S. PATENT DOCUMENTS

| | | |
|---|---|---|
| 1,765,443 | 6/1930 | Peterson . |
| 2,317,813 | 4/1943 | Schoenborn ........................ 174/35 |
| 2,844,644 | 7/1958 | Soule, Jr. ............................ 174/35 |
| 3,277,230 | 10/1966 | Stickney et al. ................ 174/35 GC |
| 3,366,918 | 1/1968 | Johnson et al. . |
| 4,659,869 | 4/1987 | Busby ............................ 174/35 GC |
| 4,760,214 | 7/1988 | Bienia et al. ................... 174/35 GC |
| 4,820,885 | 4/1989 | Lindsay ......................... 174/35 GC |
| 5,001,297 | 3/1991 | Peregrim et al. .............. 174/35 GC |
| 5,015,802 | 5/1991 | Chi ................................ 174/35 GC |
| 5,029,254 | 7/1991 | Stickney ....................... 174/35 GC |

Primary Examiner—Leo P. Picard
Assistant Examiner—B. Lee Ledynh
Attorney, Agent, or Firm—Ronald E. Myrick; Barry N. Young; Ronald C. Hudgens

[57] ABSTRACT

An EMI shielding gasket made of springy electrically conductive material. The gasket includes a pair of generally parallel laterally spaced apart U-shaped channel members each with its channel entrance facing away from the other member. A pair of ends oriented transversely of the U-shaped channel members connect the members together at their end regions. The ends are resiliently deformable to allow the U-shaped channel members to be moved more closely together to facilitate mounting the gasket.

6 Claims, 5 Drawing Sheets

EMI SHIELDING GASKET

BACKGROUND OF THE INVENTION

This invention relates to electromagnetic interference (EMI) shielding, and more particularly to a gasket for shielding such interference.

It is critical today to shield electronic equipment, such as computers, against EMI emissions. In the past, computer products worked with slower processors. Consequently, the problem of escaping emissions of these types though openings in computer enclosures was not significant. But the advent of faster processors and switching has changed this. While increased processing speeds have made remarkable improvements in computer performance and efficiency, EMI containment problems have been exacerbated.

Today it is not uncommon for computers to use clock speeds in the range of 50 to 200 MHz or more. And digital circuits operating at these high frequencies may have pulse rise times of a nanosecond or less. These speeds can cause EMI to be radiated at harmonic frequencies in excess of 1 GHz.

The Federal Communications Commission (FCC) has established standards that limit the amount of allowable EMI emissions from electronic devices. To meet FCC emissions standards it is necessary to seal around slots holding expansion or option cards and to seal around slots covered by blanks when these slots are not being used. This task is challenging in today's commercial environment.

Then too, there is commercial pressure to compact the spacing between expansion slots or openings, while still providing standard EISA/ISA expansion slots or openings. These standard slot sizes are needed to maintain interchangeability of expansion or option cards between computers even as market forces press to reduce the size of computers. This need has not been effectively met.

In the past one approach to sealing around slots and openings has been the use of individual shielding strips or clips to inhibit EMI emissions though such openings in enclosures containing electronic equipment giving off such emissions during its operations. U.S. Pat. No. 5,029,254 discloses an example of a shielding strip, which is held in place at the edge of an opening by a clamping element. During mounting of expansion or option cards, shielding strips and clips are easily knocked off. Mounting is difficult at best.

U.S. Pat. No. 4,659,869 discloses another example of a clip-on shielding strip. Shielding strips like those disclosed in these two examples present considerable difficulty. They are individually placed in position on the edges of enclosures and have the same difficultly as those mentioned in connection with the shielding strips disclosed U.S. Pat. No. 5,029,254.

Accordingly, there still exits a need for a shielding arrangement that is easily installed and that effectively retards EMI emissions.

SUMMARY OF THE INVENTION

The EMI shielding device of the invention is a gasket that is easily mounted on enclosure edge regions defining an opening requiring EMI shielding and that is self-aligning.

In a broad sense, the invention is a EMI shielding gasket made of springy electrical conducting material that includes pair of spaced apart channel members comprising resilient electrical contact means and a pair spaced apart connecting portions joining the two channel members together.

In a more specific sense, the gasket of the invention includes a pair of laterally spaced apart U-shaped channel members made of springy electrically conductive material joined together by a pair of spaced apart connecting portions also made of springy electrically conductive material. The connecting portions are oriented transversely of the U-shaped channel members and joined thereto at the end regions of the channel members. Further, the connecting portions are resiliently deformable to allow the U-shaped channel members to be moved more closely together to facilitate mounting.

The U-shaped channel members each includes a longitudinal bottom wall and two laterally spaced sidewalls extending from the bottom wall in a direction generally opposite and away form the other U-shaped member. These two sidewalls terminate at their free sides at a longitudinal channel entrance opening facing away from the other U-shaped member. Moreover, the walls of the U-shaped channel members are spaced and dimensioned to receive in mounting relationship an edge portion of the enclosure defining a slot or opening to be shielded. Further, a corresponding sidewall of each of the U-shaped members comprises spaced apart wall segments. And these segments have corners at their termination or free side that are turned outwardly of the channel. These turned out corners function as resilient electrical contacts when the gasket is in EMI shielding use.

The gaskets as disclosed herein allow more closely spaced expansion slots, including standard slots, and does so while providing good electrical contact with circuit cards, slot covers, and the like to effect EMI shielding.

Other objects, features, and advantages of the invention will became apparent as the invention is described in more detail with reference made to the accompanying drawings.

DESCRIPTION OF THE PREFERRED EMBODIMENT

Figure 1:
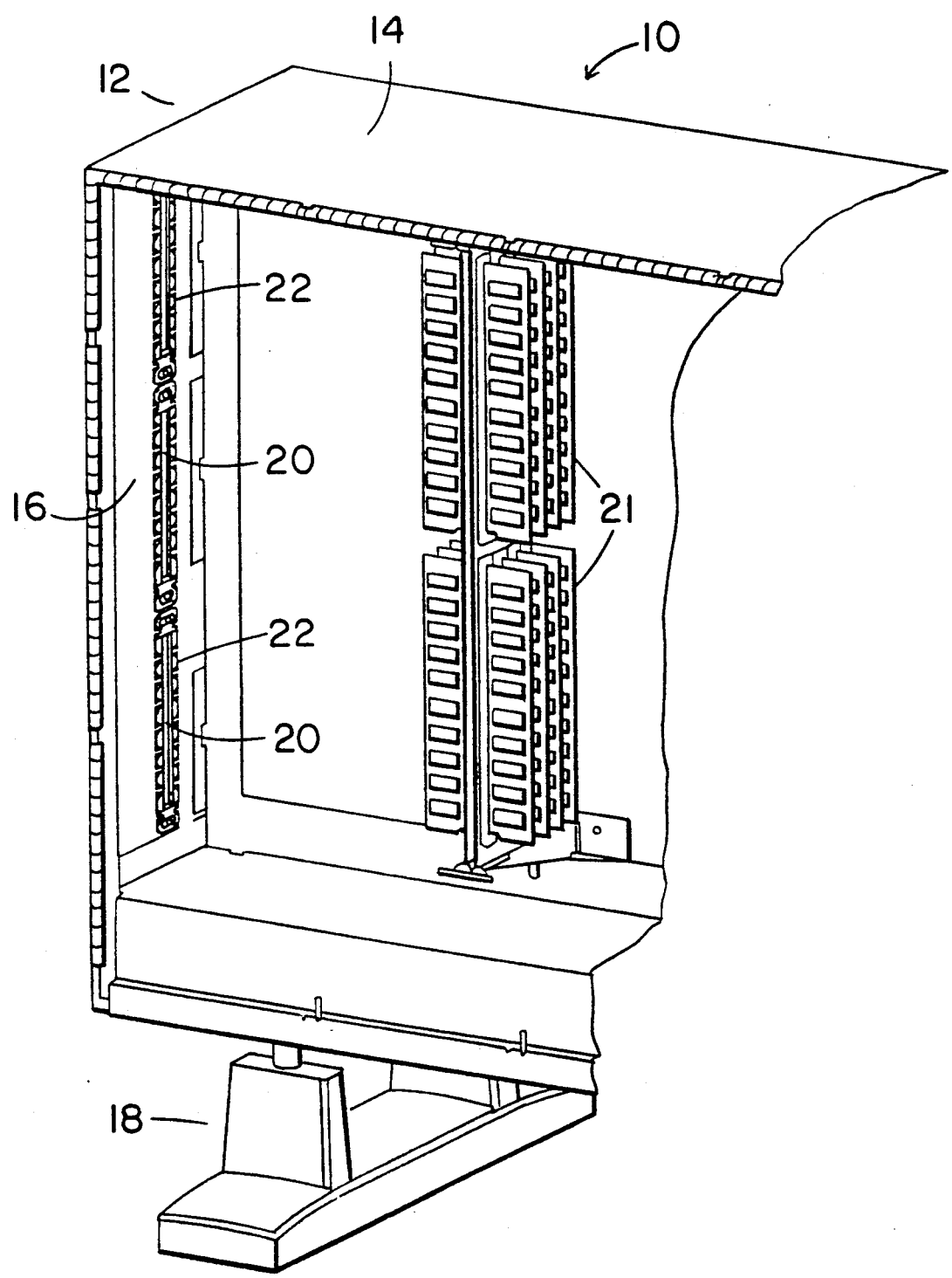
FIG. 1 is an isometric view of a portion of a computer using EMI shielding gaskets according to the principles of the invention in connection with vertically oriented expansion slots.

FIG. 1 shows a computer 10 that includes a metal enclosure 12 that comprises a top wall 14, a sidewall 16, and a base 18. As shown, the sidewall 16 has three vertically aligned rectangularly shaped expansion slots 20. The enclosure 12 holds computer components, such as storage cards 21, and electronic components (not shown) that emit high frequency EMI.

Figure 3:
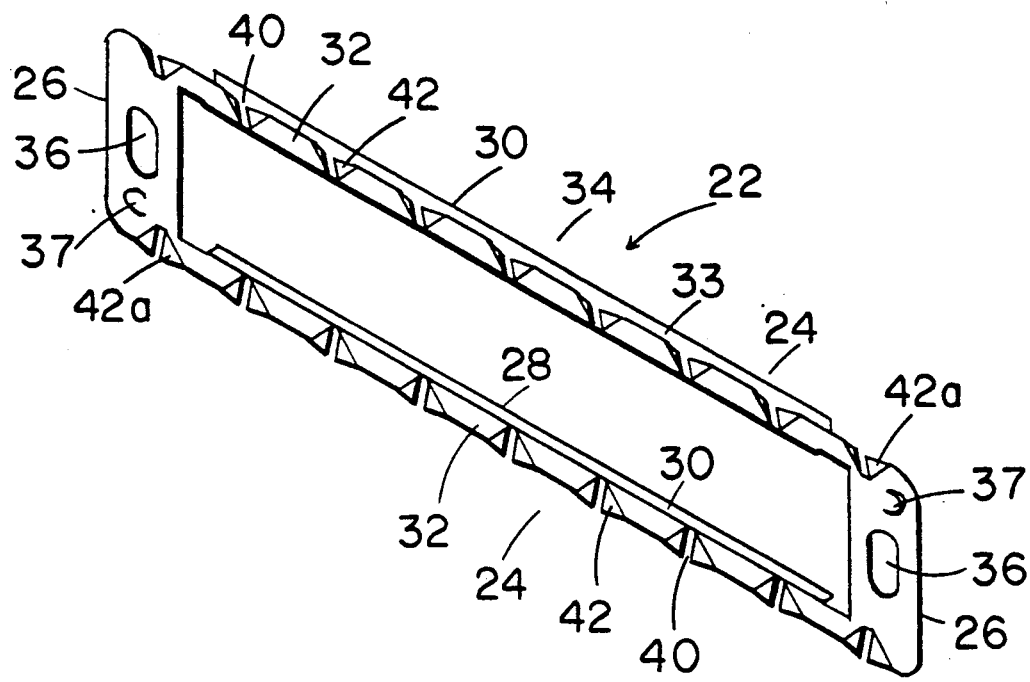
FIG. 3 is a somewhat enlarged isometric view of the EMI shielding gasket shown in use in FIGS. 1 and 2.
Figure 4:
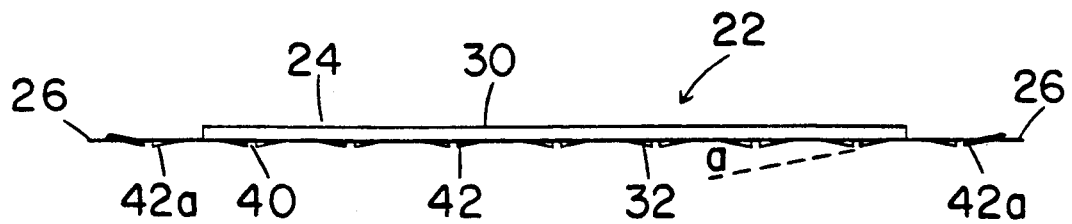
FIG. 4 is a side elevation view of the EMI shielding gasket of FIG. 3.
Figure 5:
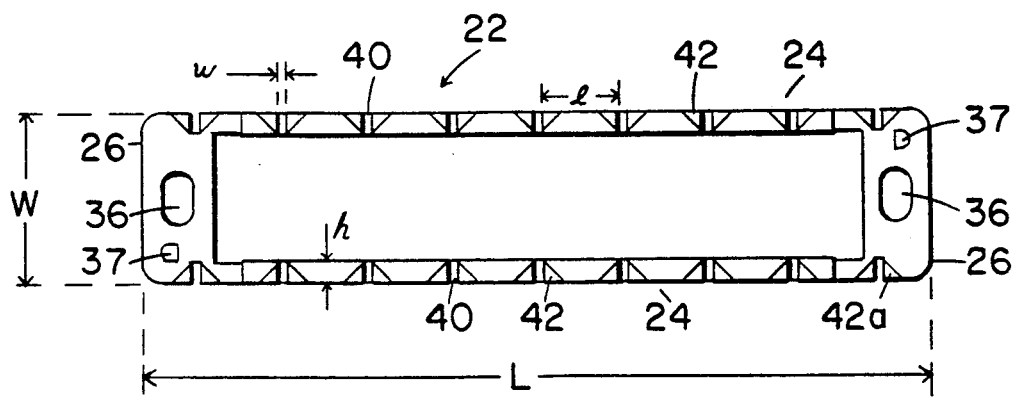
FIG. 5 is a plan view of the EMI shielding gasket of FIG. 4.

Mounted on the enclosure 12 at each of the expansion slots 20 is an EMI shielding gasket 22 made of thin springy electrically conductive material, such as stainless steel or beryllium copper. As can be more clearly seen in FIGS. 2-4, the shielding gaskets 22 as shown are rectangularly shaped to conform to the slots 20 and are formed by spaced apart U-shaped channel side members 24 and transversely oriented ends 26.

Each of the U-shaped channel side members 24 includes a longitudinal bottom wall 28 and latterly space-apart sidewalls 30 and 32 that extend in laterally spaced apart relationship from the bottom wall 28 in a direction opposite and away from the other U-shaped channel side member 24 to define a mounting channel 33. The sidewalls terminate at an entrance 34 to the channel 33.

The ends 26 are thin planar portions that are resiliently deformable and that have mounting openings 36 and tabs 37. The tabs 37 are for use with stop recesses or the like, such as indent 39 (FIG. 2), on the inside surface of an enclosure to assist in keeping a gasket 22 in place. As shown, each of the gaskets 22 is made of a single thin piece of metal, such as stainless steel or beryllium copper. The sidewalls 32 of each of the gaskets 22 lie in the same plane as the planar end portions 26. Accordingly, when mounted, the sidewalls 32 and the end portions 26 are at the inside surface of an enclosure. The sidewall 30 of each of the gaskets 22 lies in a plane latterly offset by the width of the bottom wall 28, and consequently, is on the outside of an enclosure when a gasket 22 is mounted.

As shown, each of the sidewalls 32 is formed of individual wall segments 38, which are separated by narrow spaces or slots 40. And, as indicated, the segments 38 lie in the same plane as the planar end portions 26 and include corners 42 turned outwardly of the channel 33. As shown, slots, denoted by reference numeral 40a, that are the same size and spacing as slots 40 continue into ends 26. And at these slots 40a there are turned out corners, denoted by reference numeral 42a, that are the same size and shape as turned out corners 42. These turned out corners 42 and 42a function as electrical contacts when a gasket 22 is in EMI shielding use. Because the gaskets 22 are made of springy material such as stainless steel, the turned out corners 42 and 42a themselves are resilient or springy. Accordingly, the corners 42 and 42a provide good pressing of resilient electrical contact with an expansion card face plate, cover, or the like that is fixed in place over an opening or slot of an enclosure at which a gasket 22 is used.

In practice, the distance between slots 40 will vary. Accordingly, the space between the turned out corners 42 and 42a will vary, in a conventional way, depending upon the frequency of EMI emitted by electronic components held in an enclosure to effect good EMI shielding.

Figure 2:
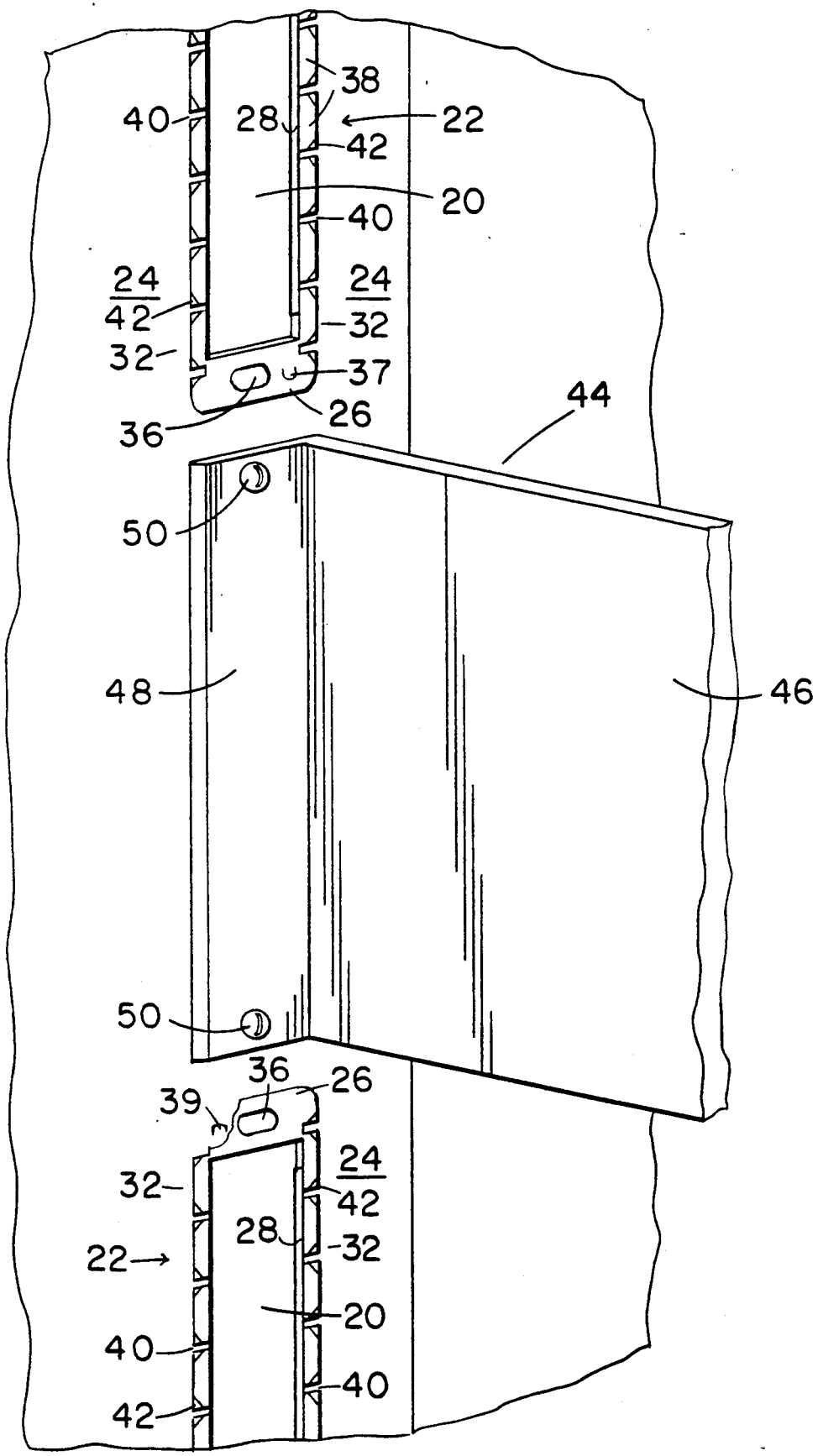
FIG. 2 is an enlarged isometric view of a interior expansion slot region of the computer shown in FIG. 1.

FIG. 2 shows a view of the interior expansion slot region of the computer enclosure 12 with an option or expansion card 44 in place at one of the expansion slots 20. The card 44 includes a circuit card 46 and a connector or face plate 48. Screws 50 fix the card 44 to the interior surface of the sidewall 16. And there is a gasket 22 mounted at the slot 20 that is covered by the face plate 48 of the card 44. The turned out corners 42 and 42a of that gasket 22 are pressed by the contacting surface of the face plate 48. So the corners 42 and 42a are resiliently urged into electrical contact with the face plate 48.

Figure 6:
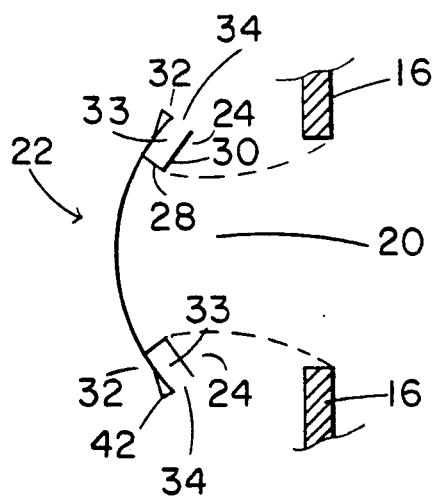
FIG. 6 is a section view of an the EMI gasket and expansion slot shown in FIGS. 1-5 with the gasket held in a bowed condition in preparation for mounting in the expansion slot.
Figure 7:
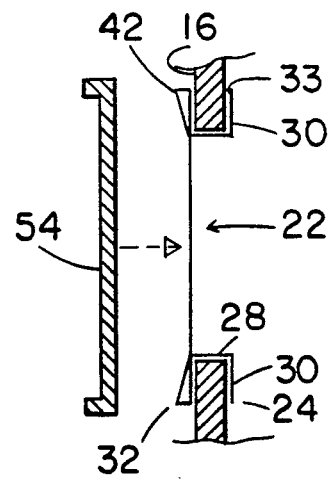
FIG. 7 is a section view of the EMI gasket of FIG. 6 mounted at the expansion slot.

FIG. 6 shows one of the gaskets 22 held in position to be mounted at a slot 20. As indicated, the ends 26 are held in a bowed condition for snap-in mounting of the gasket 22. In this bowed condition the U-shaped side channel members 24 of the gasket 22 are placed closer together for ease of mounting and the channel entrances 34 are disposed for easier mounting. FIG. 7 shows the gasket 22 mounted at the slot 20 with a slot cover 54 positioned to cover the slot 20. When mounted, the ends 26, which are resiliently deformable, are once again planar and the edge regions 52 of the enclosure 12 defining the slot 20 have been received in mounted relationship in the channels 33 of the U-shaped members 24.

Shielding gaskets like those shown in FIGS. 1-6 can be used to provide effective EMI shielding for enclosures containing electronic components generating emissions over a range of frequencies. As shown, the gasket 22 is aimed at shielding frequencies up and including a range of from about 1 to 10 GHz. For this range, and referring to FIG. 5, a gasket 22 has been used that has a length, l, of 4.38 inches and a width, W, of 0.980 inches. The height, h, of the sidewalls 30 and 32 is 0.127 inches, and the length, l, of the segments 38 is 0.450 inches. The width of the slots 40 is 0.05 inches. The corners 42 and 42a are turned outwardly an angle A (FIG. 4) of from 20 to 30 degrees, 25 degrees being usual. The gaskets 22 are normally made from zero gauge stainless steel having a thinness of 0.003-0.004 inches.

Figure 8:
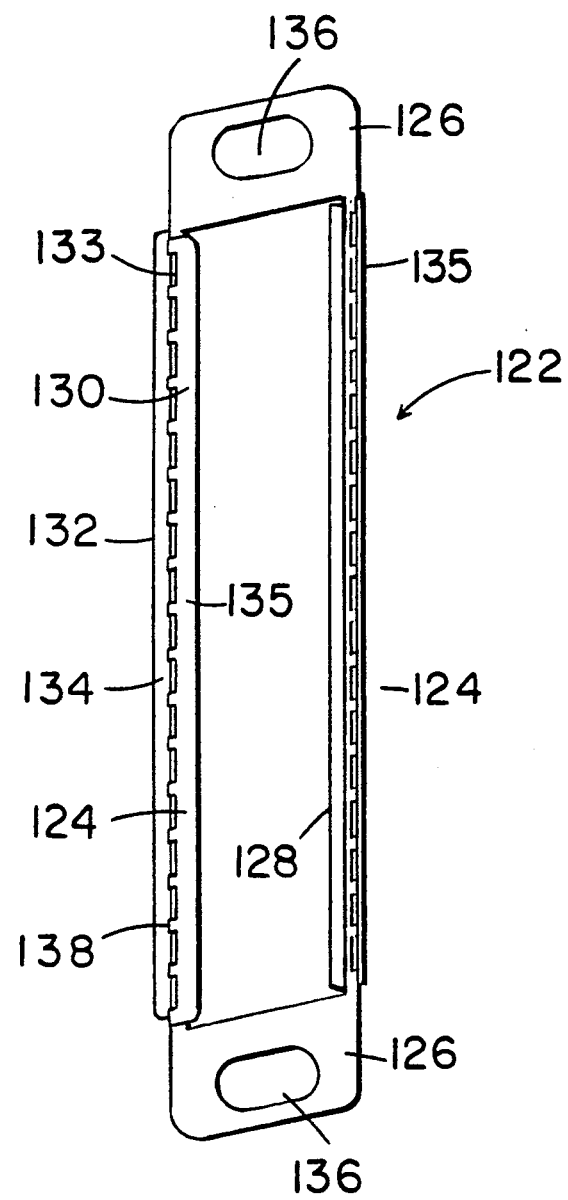
FIG. 8 is a isometric view of an alternate EMI shielding gasket.

FIG. 8 is a view of an alternate embodiment of the invention. In FIG. 8 there is shown a shielding gasket 122 made of thin springy electrically conductive material, such as stainless steel or beryllium copper. The gasket 122 is defined by spaced apart U-shaped side members 124 and transversely oriented ends 126.

Each of the U-shaped side members 124 includes a bottom wall 128 and two latterly spaced apart sidewalls 130 and 132 that extend from the bottom wall 128 in a direction opposite and away from the other U-shaped side member 124 to define a mounting channel 133. The sidewalls 130 and 132 terminate at an entrance 134 to the channel 133. And the sidewall 132 has a spring or resilient electrical contact portion 135 running the length of the sidewall 132. As shown, the contact portion 135 has been formed by being bend at the free side of the sidewall 132. The portion 135 is inclined to the plane of the gasket 122 at an angle of from about 20-30 degrees, normally 25 degrees. The contact portion 135 and the sidewall 132 are connected by spaced apart connectors 138. These connectors 138 function to allow the surface of the contact portion 135 conform to any non-uniformities in a contacting surface.

In practice, the electric contact portions 135 make resilient or springy electrical contact with a metal enclosure when place in EMI shielding at an opening or slot of an enclosure.

The ends 126 are thin planar portions that are resiliently deformable and that have mounting openings 136. And, as shown, the gasket 122 is made of a single thin piece of metal, such as stainless steel or beryllium copper. The sidewalls 130 and 132 lie in the same plan as the end 126.

Like the shielding gasket shown in FIGS. 1-7, gasket 122 can be used with enclosures containing electronic components generating emissions over a range of frequencies. As shown, the gasket 122 is aimed at shielding frequencies up to and including a range of about 1 to 10 GH$_z$. As shown in FIG. 8, the connectors 138 are spaced apart a distance, d, of 0.135 inches and have a width, w, of 0.06 inches. The height, h, of the sidewall 132 is 0.130 inches.

It will be appreciated that the gaskets 22 and 122 have been depicted for use at a standard EISA/ISA opening or slot. Hence, it is to be understood that gaskets according to the principles of the invention can be other shapes and sizes.

It is apparent that within the scope of the invention modifications and different arrangements may be made other than herein disclosed other than herein disclosed. The disclosure is merely illustrative, the invention comprehending all variations thereof.

We claim:

1. An EMI shielding gasket for use at an opening in an enclosure housing electronic components that radiate high frequency electromagnetic emissions during operation comprising:

a pair of generally parallel laterally spaced apart U-shaped channel members made of springy electrically conductive material, each of the pair of U-shaped channel members including a longitudinal bottom wall and two side walls extending from the bottom wall in a direction generally opposite and away from the other U-shaped member to terminate at a longitudinal channel entrance opening facing away from the other U-shaped member, the bottom and side walls being spaced and dimensioned to received in mounting relationship an edge portion of the enclosure defining an edge of the opening, a corresponding side wall each of the U-shaped members comprising spaced apart wall segments, the free side of each of such wall segments at the longitudinal channel entrance having turned out corners each forming a resilient electrical contact when the gasket is in EMI shielding use; and a pair of parallel spaced apart springy electrically conductive connecting portions oriented transversely of the U-shaped channel members and joined thereto at their end regions, such connecting portions being resiliently deformable to allow the U-shaped channel members to be moved more closely together to facilitate mounting the U-shaped channel members on opposite edges of the enclosure opening.

2. The EMI shielding gasket of claim 1 wherein such gasket is made of a single piece of metal.

3. The EMI shielding gasket of claim 1 wherein the corners of the wall segments are turned outwardly from 20 to 30 degrees.

4. The EMI shielding gasket of claim 1 wherein the connecting portions are planar and such planar connecting portions have a mounting opening.

5. The EMI shielding gasket of claim 4 wherein the planar connecting portions have tabs for placement of the gasket at an enclosure opening.

6. An enclosure for housing electronic components that radiate high frequency electromagnetic emissions during their operation comprising:

a wall having an expansion opening;

An EMI shielding gasket mounted at the opening of the wall, the shielding gasket having a pair of generally parallel laterally spaced apart U-shaped channel members made of springy electrically conductive material, each of the pair of U-shaped channel members including a longitudinal bottom wall and two side walls extending from the bottom wall in a direction generally opposite and away from the other U-shaped member to terminate at a longitudinal channel entrance opening facing away from the other U-shaped member, the bottom and side walls being spaced and dimensioned to receive in mounting relationship an edge portion of the enclosure defining an edge of the opening, a corresponding side wall of each of the pair of U-shaped members comprising spaced apart wall segments, the free side opening having corners turned outwardly of the channel, such turned out corners each forming a resilient electrical contact when the gasket is in EMI shielding use; and a pair of parallel spaced apart springy electrically conductive connecting portions oriented transversely of the U-shaped channel member and joined thereto at their end regions, such connecting portions being resiliently deformable to allow the U-shaped channel members to be moved more closely together to facilitate mounting the U-shaped channel members o opposite edges of the enclosure opening.

* * * * *